(12) United States Patent
Kim et al.

(10) Patent No.: US 7,053,418 B2
(45) Date of Patent: May 30, 2006

(54) NITRIDE BASED SEMICONDUCTOR DEVICE

(75) Inventors: Sun Woo Kim, Seoul (KR); Jeong Tak Oh, Kyungki-do (KR); Je Won Kim, Kyungki-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 50 days.

(21) Appl. No.: 10/939,361

(22) Filed: Sep. 14, 2004

(65) Prior Publication Data

US 2005/0285125 A1    Dec. 29, 2005

(30) Foreign Application Priority Data

Jun. 25, 2004    (KR)    ............ 10-2004-0048077

(51) Int. Cl.
*H01L 29/201*    (2006.01)
(52) U.S. Cl. ............ 257/97; 257/96; 257/196; 257/15
(58) Field of Classification Search ............ 257/94, 257/96, 97, 103, 196, 201, 14, 15, 18, 615, 257/E33.031–E33.034, E33.028, E33.027; 372/45.012
See application file for complete search history.

(56) References Cited

U.S. PATENT DOCUMENTS

| | | | |
|---|---|---|---|
| 5,929,466 A * | 7/1999 | Ohba et al. ............ | 257/103 |
| 5,959,307 A | 9/1999 | Nakamura et al. | |
| 6,337,493 B1 * | 1/2002 | Tanizawa et al. ............ | 257/79 |
| 6,806,507 B1 * | 10/2004 | Ishida ............ | 257/101 |
| 2002/0179923 A1 * | 12/2002 | Morita et al. ............ | 257/103 |

OTHER PUBLICATIONS

Publication: Applied Physics Letters vol. 73, No. 8, Aug. 24, 1998, p. 1128-1130 Title: Influence of Si doping on characteristics of InGaN/GaN multiple quantum wells Author: Yong-Hoon Cho, J.J. Song, S. Keller, M.S. Minsky, E. Hu, U. K. Mishara, and S. P. DenBaars.
Publication: H. Protzmann et al. : Interface Treatment of GaN/InGaN-Multi QW Structures (1999) p. 649-654 Title: Interface Treatment of GaN/InGaN-Multi Quantum Well Structures Grown in Production Type MOVPE Systems Author: H. Protzmann, M. Lunenburger, J. Blasing, A. Krost, M. Heuken, and H. Jurgensen.

* cited by examiner

*Primary Examiner*—Kenneth Packer
*Assistant Examiner*—Matthew C Landau
(74) *Attorney, Agent, or Firm*—Lowe Hauptman & Berner, LLP

(57) ABSTRACT

The present invention provides a nitride semiconductor device comprising an active layer of a quantum well structure, a first conductive clad layer and a second conductive clad layer. The first conductive clad layer is made of the quaternary nitride semiconductor InAlGaN having a lattice constant equal to or larger than that of the active layer and includes a first nitride semiconductor layer having an energy band gap larger than that of the active layer, a second nitride semiconductor layer having an energy band gap smaller than that of the first nitride semiconductor layer and a third nitride semiconductor layer having an energy band gap larger than that of the second nitride semiconductor layer, sequentially closer to the active layer.

7 Claims, 3 Drawing Sheets

NITRIDE BASED SEMICONDUCTOR DEVICE

RELATED APPLICATIONS

The present application is based on, and claims priority from, Korean Application Serial Number 2004-48077, filed Jun. 25, 2004, the disclosure of which is hereby incorporated by reference herein in its entirety.

BACKGROUND OF THE INVENTION

1. Field of the Invention

The present invention relates to a nitride semiconductor device such as a light-emitting device, laser, or the like, and more particularly to a nitride semiconductor device capable of increasing carrier injection efficiency and at the same time, capable of preventing reduction of light efficiency due to stress by improving a structure of a lower clad layer of an active layer thereof.

2. Description of the Related Art

Generally, a nitride semiconductor device is a high output power optical device that produces short wavelength light such as blue light, green light, or the like, thus enabling it to produce a variety of colors, and is actively employed as a light emitting diode (LED) and a laser diode (LD). Usually, the nitride semiconductor device is prepared by growing an epitaxial layer on a substrate such as sapphire or SiC using Metal Organic Chemical Vapor Deposition (MOCVD), and the like.

Light efficiency of such a nitride semiconductor device is determined by internal quantum efficiency and light-extracting efficiency. Generally, internal quantum efficiency is the recombination probability between electrons and holes in the active layer and is determined by the structure of the active layer and the quality of the nitride epitaxial layer.

As conventional schemes to improve internal quantum efficiency, there have been proposed doping of Si on a quantum barrier layer (Applied Physics Letters Vol. 73, 1128 (1998)), and improving film quality of the quantum barrier layer by differing growth temperature between a quantum well layer and the quantum barrier layer (Physics Stat. Sol. 9a), 176, 649 (1999)).

Alternatively, a scheme to increase carrier injection efficiency by improving the structure of a clad layer adjacent to the active layer is under study. For example, in accordance with U.S. Pat. No. 5,959,307, by configuring a first clad layer having an energy band gap larger than that of the active layer, a second clad layer having an energy band gap smaller than that of the first clad layer and a third clad layer having an energy band gap larger than that of the second clad layer as a p- or n-type clad layer, sequentially closer to the active layer, electrons injected from the third clad layer were injected by tunneling from the first thin clad layer into the active layer and overflow of carriers from the active layer were prevented by the first clad layer having a high energy band gap. Therefore, even when the temperature of the device rises, an optical device capable of generating high output power without overflow of carriers can be provided.

In order to configure the clad layers satisfying energy band gap conditions required by the above-mentioned reference, Al content is controlled to secure large difference of energy band gap therebetween. For instance, when it is desired to construct the lower clad layer (usually, an n-type clad layer), the first and third clad layers are formed of AlGaN, and the second layer is formed of GaN.

However, when different clad layers as described above were designed, stress due to differences of lattice constants therebetween occurred, and this stress may be applied to the active layer. On the active layer to which the stress is applied, a piezoelectric field is formed and thus a phenomenon occurrs in which a distance between wave functions of electrons and holes increases in the active layer. As a result, this phenomenon causes a reduction of light efficiency of the device.

SUMMARY OF THE INVENTION

Therefore, the present invention has been made in view of the above problems, and it is an object of the present invention to provide a nitride semiconductor device having a novel lower clad layer for improving internal quantum efficiency, capable of increasing efficiency of carrier injected to an active layer while overcoming a problem associated with reduction of light efficiency due to the occurrence of stress.

In accordance with the present invention, the above and other objects can be accomplished by the provision of a nitride semiconductor device comprising;

an active layer of a quantum well structure having upper and lower surfaces;

a first conductive clad layer disposed on the lower surface of the active layer; and a second conductive clad layer disposed on the upper surface of the active layer;

wherein the first conductive clad layer is made of the quaternary nitride semiconductor InAlGaN having a lattice constant equal to or larger than that of the active layer and includes a first nitride semiconductor layer having an energy band gap larger than that of the active layer, a second nitride semiconductor layer having an energy band gap smaller than that of the first nitride semiconductor layer and a third nitride semiconductor layer having an energy band gap larger than that of the second nitride semiconductor layer, sequentially closer to the active layer.

In one embodiment of the present invention, the active layer has a multiple quantum well structure including a plurality of quantum well layers and a plurality of quantum barrier layers alternatively laminated thereon. The first conductive clad layer may have a lattice constant equal to or larger than those of the quantum well layers.

Further, when the lattice constant of the quantum well layer has a value of a and the first, second and third nitride semiconductor layers are represented by the following formula, the layers may be made of a composition having the formula of $In_xAl_yGa_{1-(x+y)}N$ and satisfying the condition in which $0<x<1$, $0<y<1$, $0<x+y<1$, and $a \leq 0.359x - 0.077y + 3.189$.

Preferably, the first, second and third nitride semiconductor layers have the same lattice constant, and more preferably, have the same lattice constant as that of the active layer.

Preferably, the first nitride semiconductor layer has a thickness of 1 to 50 nm and the second nitride semiconductor layer has a thickness of 2 to 100 nm.

In another embodiment of the present invention, the second conductive clad layer may include a first nitride semiconductor layer having an energy band gap larger than that of the active layer, a second nitride semiconductor layer having an energy band gap smaller than that of the first nitride semiconductor layer and a third clad layer having an energy band gap larger than that of the second nitride semiconductor layer, sequentially closer to the active layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, the present invention will be described in detail with reference to the attached drawings.

Figure 1:
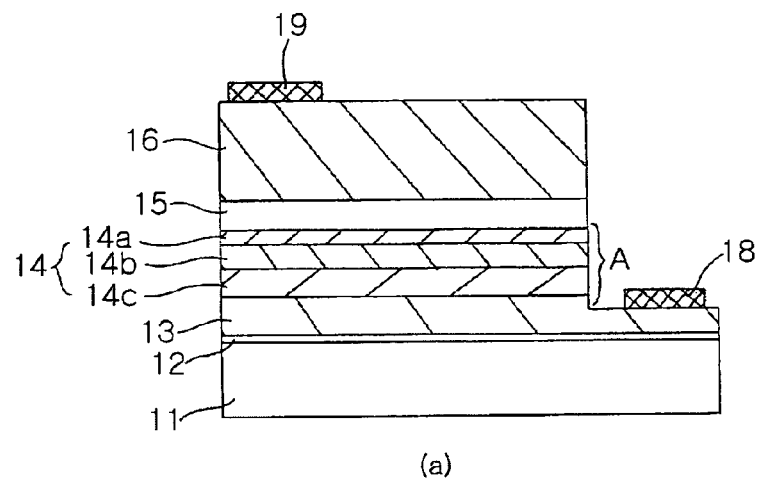
FIG. 1a is a cross-sectional side view of a nitride semiconductor device of one embodiment in accordance with the present invention.
FIGS. 1b and 1c are, respectively, graphs showing an energy band and a lattice constant of a nitride semiconductor device of one embodiment in accordance with the present invention.
Figure 1:
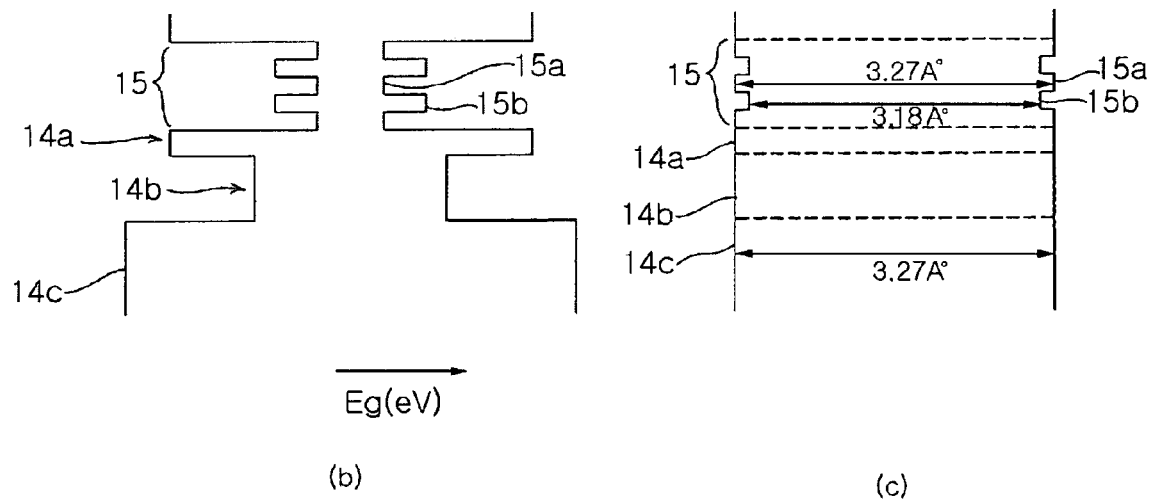

FIG. 1a is a cross-sectional side view of a nitride semiconductor device 10 in accordance with one embodiment of the present invention.

Referring to FIG. 1a, the nitride semiconductor device 10 includes a nitride semiconductor laminate structure on a substrate 11 having a buffer layer 12 formed thereon. The substrate 11 may be sapphire, SiC or GaN. The buffer layer 12 is a low temperature nucleus-growth layer made of $Al_xGa_{1-x}N$.

The nitride semiconductor laminate structure may include an n-type GaN layer 13, an n-type clad layer 14, an active layer 15 and a p-type clad layer 16 sequentially formed on the buffer layer 12. The n-type clad layer 14 in accordance with the present invention is made of quaternary InAlGaN, and in order to increase electron injection efficiency, is composed of a first, second and third nitride semiconductor layers 14a, 14b and 14c, sequentially closer to the active layer 15. A p-electrode 19 and an n-electrode 18 are formed on the p-type clad layer 16 and the exposed upper surface of the n-type GaN layer 13, respectively.

As shown in a graph of an energy band gap in FIG. 1b, in order to improve electron injection efficiency, the first, second and third nitride semiconductor layers 14a, 14b and 14c constituting the n-type clad layer 14 have different energy band gaps. That is, the first nitride semiconductor layer 14a is formed of material having an energy band gap larger than that of the active layer 15, the second nitride semiconductor layer 14b is formed of material having an energy band gap smaller than that of the first nitride semiconductor layer 14a, and the third nitride semiconductor layer 14c is formed of material having an energy band gap larger that that of the second nitride semiconductor layer 14b. Preferably, the first nitride semiconductor layer 14a has a thickness of 1 to 50 nm and the second nitride semiconductor layer 14b has a thickness of 2 to 100 nm.

Therefore, electrons injected from the n-type GaN layer 13 and the third nitride semiconductor layer 14c are supplied by tunneling from the first nitride semiconductor layer 14a to the active layer 15, but the first nitride semiconductor layer 14a having a relatively higher energy band gap prevents electrons from overflowing from the active layer 15 to the n-type clad layer 14, thereby improving electron injection efficiency.

Further, the n-type clad layer 14 in accordance with the present invention may be formed of a quaternary InAlGaN material having a lattice constant equal to or larger than that of the active layer 15 so that a piezoelectric field is not applied to the active layer following production of stress due to the differences of the lattice constants therebetween. The active layer 15 may have a multiple quantum well structure including a plurality of quantum well layers 15a and a plurality of quantum barrier layers 15b alternatively laminated thereon. In this case, the n-type clad layer 14 may be made of a nitride semiconductor material having a lattice constant equal to or larger than that of the quantum well layer 15a.

Preferably, as shown in FIG. 1c, all the first, second and third clad layers 14a, 14b and 14c are configured to have the same lattice constant, and further may be formed of material having the same lattice constant as that of the active layer 15 (more specifically, the quantum well layer 15a).

Figure 2:
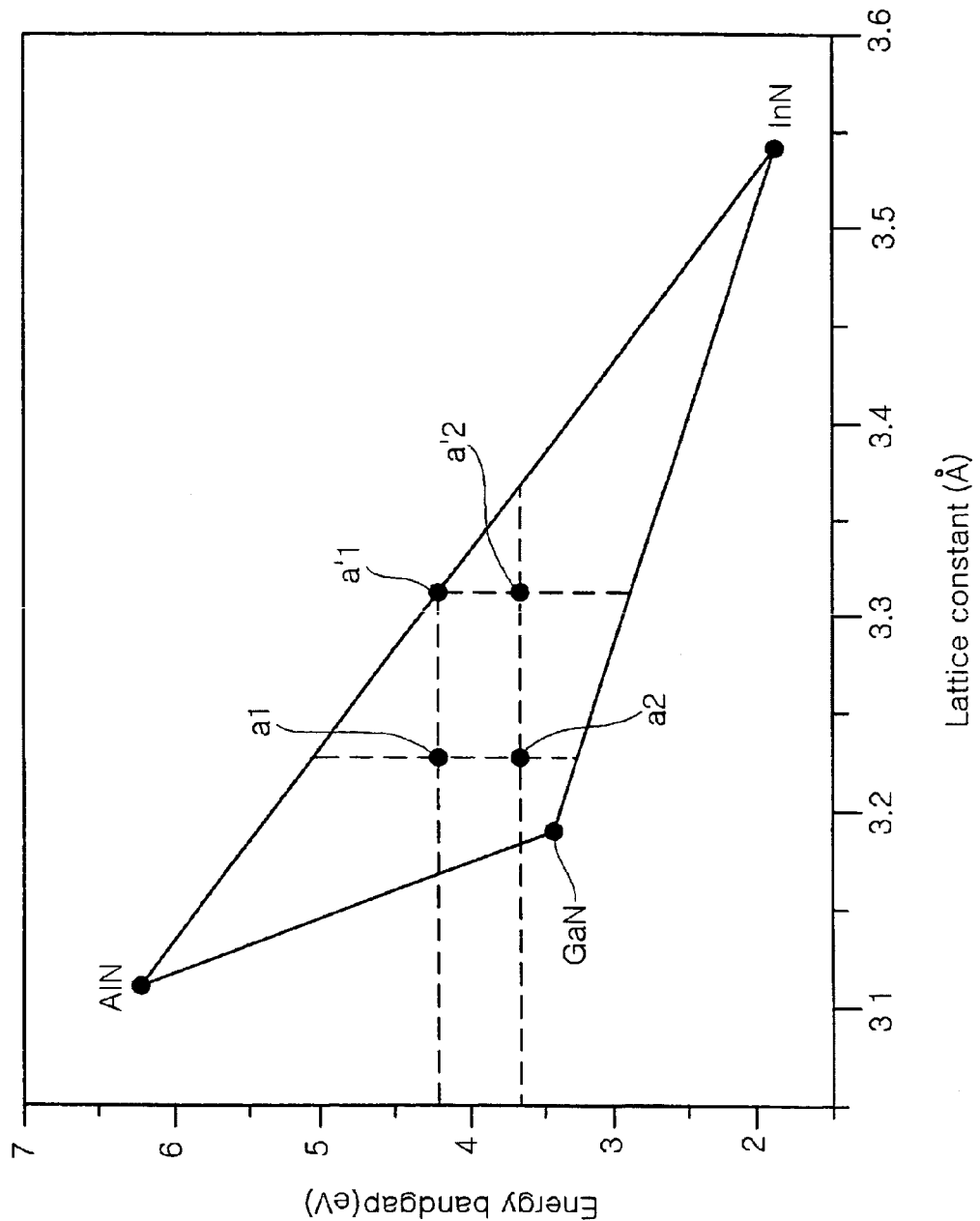
FIG. 2 is a graph showing the relationship between the energy band gap and the lattice constant of a nitride semiconductor for illustrating a principle which is applied to the present invention.

For instance, in the configuration in which the active layer 15 is composed of the quantum barrier layer 15b of GaN and the quantum well layer 15a of $In_{0.1}Ga_{0.9}N$, the lattice constants of the quantum barrier layer 15b and the quantum well layer 15a are about 3.18 Å and about 3.27 Å, respectively. In this case, the first, second and third nitride semiconductor layers 14a, 14b and 14c are made of nitride semiconductor material of the quaternary $In_xAl_yGa_{1-(x+y)}N$ (0<x<1, 0<y<1, 0<x+y<1) having a lattice constant of 3.27 Å or more while satisfying the condition of the energy band gap as shown in FIG. 2b. The n-type clad layer 14 reducing the stress while satisfying the condition of the energy band gap in accordance with the present invention may be appropriately selected by using the graph shown in FIG. 2.

FIG. 2 is a graph showing the relationship between the energy band gap and the lattice constant of a nitride semiconductor for illustrating a principle that is applied to the present invention.

Referring to the graph shown in FIG. 2, when the quantum well layer is made of $In_{0.1}Ga_{0.9}N$, the energy band gap thereof is 3.2 eV and the lattice constant a is 3.27, as illustrated in FIG. 1c.

To impart the n-type clad layer with the same lattice constant as that of the quantum well layer, the first and third nitride semiconductor layer may be made of $In_{x1}Al_{y1}Ga_{1-(x1+y1)}N$ (0<$x_1$<1, 0<$y_1$<1 and 0<$x_1+y_1$<1) represented by a1, and the second nitride semiconductor layer may be made of $In_{x2}Al_{y2}Ga_{1-(x2+y2)}N$ (0<$x_2$<1, 0<$y_2$<1 and 0<$x_2+y_2$<1) represented by a2.

Alternatively, the n-type clad layer may be configured to have a lattice constant slightly larger than that of the active layer so as to reduce the stress causing a piezoelectric field. For example, the first and third nitride semiconductor layers may be made of the quaternary nitride semiconductor layer represented by a'1, and the second nitride semiconductor layer may be made of the quaternary nitride semiconductor layer represented by a'2. In this embodiment, the first and third nitride semiconductor layers are formed of the same component, but they may also be formed of nitride semiconductor material of another component satisfying the above-mentioned energy band gap conditions and the lattice constant conditions according to the present invention.

Based on the graph shown in FIG. 2, the first, second and third nitride semiconductor layers constituting the n-type clad layer can be defined in terms of a numerical equation. First, the lattice constant ($a_{InAlGaM}$) of the quaternary nitride semiconductor layer can be defined in terms of the relation between the lattice constant (3.548 Å) of InN, the lattice constant (3.112 Å) of AlN, and the lattice constant (3.189 Å) of GaN as follows:

$$a_{InAlGaN} = x \cdot a_{InN} + y \cdot a_{AlN} + (1-x-y) \cdot a_{GaN}$$

$$a_{InAlGaN} = 0.359x - 0.077y + 3.189$$

wherein x and y represents In and Al content, respectively.

Accordingly, given that the lattice constant of the active layer, in particular the quantum well layer, has a value of a, the ratio of In component:Al component in the n-type clad layer in accordance with the present invention can be defined as follows:

$$a \leq 0.359x - 0.077y + 3.189$$

Figure 3:
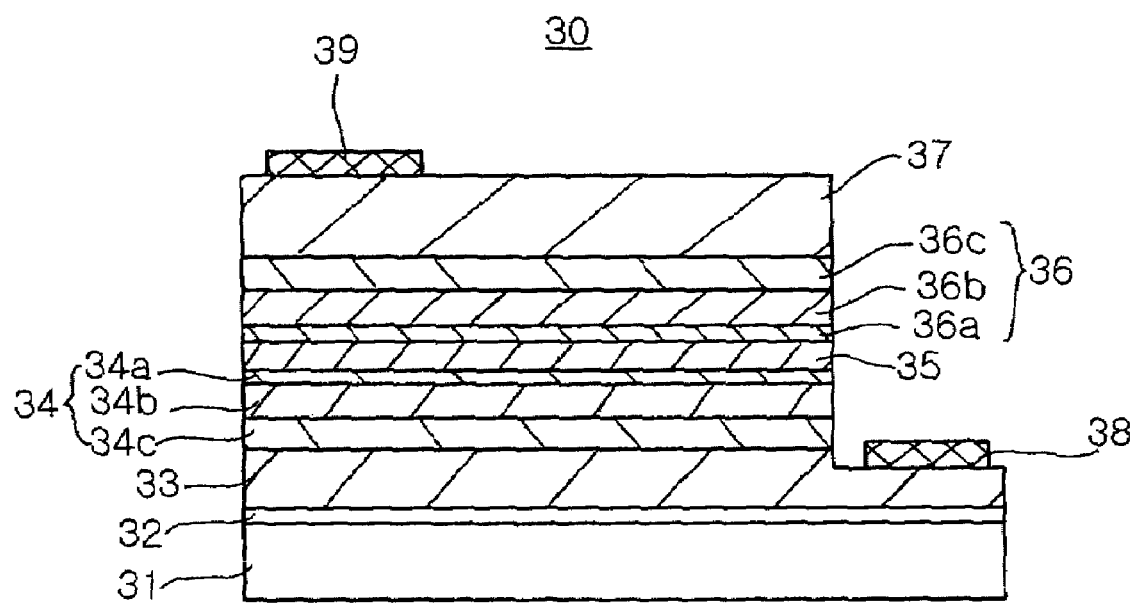
FIG. 3 is a cross-sectional side view of a nitride semiconductor device of another embodiment in accordance with the present invention.

FIG. 3 is a cross-sectional side view of a nitride semiconductor device 30 of another embodiment in accordance with the present invention. This embodiment illustrates a configuration of the nitride semiconductor device in which a structure of a p-type clad layer was further improved in order to increase hole injection efficiency while having a similar structure as in FIG. 1a.

Referring to FIG. 3, the nitride semiconductor device 30 may include a nitride semiconductor laminate structure on a substrate 31 having a buffer layer 32 formed thereon, similarly to FIG. 1a. The substrate 31 may be sapphire, SiC, or GaN substrate. The buffer layer 32 may be a low temperature nucleus-growth layer of $Al_xGa_{1-x}N$.

The nitride semiconductor laminate structure may include an n-type GaN layer 33, an n-type clad layer 34, an active layer 35, a p-type clad layer 36 and a p-type GaN layer 37 sequentially formed on the buffer layer 32.

In this embodiment, the n-type clad layer 34 is made of the quaternary InAlGaN and in order to improve electron injection efficiency, is composed of the first, second and third n-type nitride semiconductor layers 34a, 34b and 34c, sequentially closer to the active layer 35. Similarly, the p-type clad layer 36 may also be made of the quaternary InAlGaN and in order to improve electron injection efficiency, is composed of the first, second and third p-type nitride semiconductor layers 36a, 36b and 36c, sequentially closer to the active layer 35. A p-electrode 39 and an n-electrode 38 are formed on the p-type GaN layer 37 and the exposed upper surface of the n-type GaN layer 33, respectively.

In order to increase the amount of electrons injected from the n-type GaN layer, the n-type clad layer 34 may be formed of the first n-type nitride semiconductor layer 34a of material having an energy band gap larger than that of the active layer 35, the second n-type nitride semiconductor layer 34b of material having an energy band gap smaller than that of the first n-type nitride semiconductor layer 34a and the third n-type nitride semiconductor layer 34c of material having an energy band gap larger than that of the second n-type nitride semiconductor layer 34b. Preferably, the first n-type nitride semiconductor layer 34a has a thickness of 1 to 50 nm and the second n-type nitride semiconductor layer 34b has a thickness of 2 to 100 nm.

Further, the n-type clad layer 34 in accordance with the present invention may be formed of the quaternary InAlGaN material having a lattice constant equal to or larger than that of the active layer 35 so that a piezoelectric field is not applied to the active layer 35 following production of stress due to the differences of the lattice constant therebetween. Preferably, all the first, second and third n-type nitride semiconductor layers 34a, 34b and 34c are configured to have the same lattice constant, and further may be formed of material having the same lattice constant as that of the active layer 35.

In this embodiment, similar to the structure of the n-type clad layer 34, the p-type clad layer 36 may also be formed of the first p-type nitride semiconductor layer 36a of material having an energy band gap larger than that of the active layer 35, the second p-type nitride semiconductor layer 36b of material having an energy band gap smaller than that of the first p-type nitride semiconductor layer 36a and the third p-type nitride semiconductor layer 36c of material having an energy band gap larger than that of the second p-type nitride semiconductor layer 36b. Therefore, hole injection effect of the p-type GaN layer 37 may be improved and thereby overall internal quantum efficiency may be improved. Further, improvement of the n-type clad layer 34 may solve the problems associated with stress due to the lattice constant difference, and thereby reduction of light efficiency due to the piezoelectric field can be prevented.

As apparent from the above description, in accordance with the nitride semiconductor device of the present invention, a configuration of the lower clad layer (n-type clad layer) composed of three layers having different energy band gaps, and having a lattice constant equal to or larger than that of the active layer, improves carrier injection efficiency, and prevents deterioration of light efficiency resulting from differences of lattice constants therebetween.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor device comprising;
   an active layer of a quantum well structure having upper and lower surfaces;
   a first conductive clad layer disposed on the lower surface of the active layer; and
   a second conductive clad layer disposed on the upper surface of the active layer;
   wherein the first conductive clad layer is made of the quaternary nitride semiconductor InAlGaN having a lattice constant equal to or larger than that of the active layer and includes a first nitride semiconductor layer having an energy band gap larger than that of the active layer, a second nitride semiconductor layer having an energy band gap smaller than that of the first nitride semiconductor layer and a third nitride semiconductor layer having an energy band gap larger than that of the second nitride semiconductor layer, sequentially closer to the active layer.

2. The nitride semiconductor device as set forth in claim 1, wherein the active layer has a structure including a plurality of quantum well layers and a plurality of quantum barrier layers alternatively laminated thereon, and the first conductive clad layer has a lattice constant equal to or larger than those of the quantum well layers.

3. The nitride semiconductor device as set forth in claim 2, wherein when the lattice constant of the quantum well layer has a value of a and the first, second and third nitride semiconductor layers are represented by the following formula, the layers are made of a composition having the formula of $In_xAl_yGa_{1-(x+y)}N$ and satisfying the condition in which $0<x<1$, $0<y<1$, $0<x+y<1$, and, $a \leq 0.359x - 0.077y + 3.189$.

4. The nitride semiconductor device as set forth in claim 1, wherein the first, second and third nitride semiconductor layers have the same lattice constant.

5. The nitride semiconductor device as set forth in claim 1, wherein the first, second and third nitride semiconductor layers have the same lattice constant as that of the active layer.

6. The nitride semiconductor device as set forth in claim 1, wherein the first nitride semiconductor layer has a thickness of 1 to 50 nm and the second nitride semiconductor layer has a thickness of 2 to 100 nm.

7. The nitride semiconductor device as set forth in claim 1, wherein the second conductive clad layer includes a first nitride semiconductor layer having an energy band gap larger than that of the active layer, a second nitride semiconductor layer having an energy band gap smaller than that of the first nitride semiconductor layer and a third nitride semiconductor layer having an energy band gap larger than that of the second nitride semiconductor layer, sequentially closer to the active layer.

* * * * *

UNITED STATES PATENT AND TRADEMARK OFFICE
CERTIFICATE OF CORRECTION

PATENT NO. : 7,053,418 B2 Page 1 of 1
APPLICATION NO. : 10/939361
DATED : May 30, 2006
INVENTOR(S) : Kim et al.

It is certified that error appears in the above-identified patent and that said Letters Patent is hereby corrected as shown below:

On Title page
Item (75) Inventors: The first Inventor "Sun Woo Kim" should be listed as --Sun Woon Kim--.

Signed and Sealed this

Thirtieth Day of January, 2007

JON W. DUDAS
*Director of the United States Patent and Trademark Office*